United States Patent [19]

Bernd et al.

[11] Patent Number: 5,731,541
[45] Date of Patent: Mar. 24, 1998

[54] SCREENING ELEMENT AND PROCESS FOR PRODUCING IT

[75] Inventors: Tiburtius Bernd, Kleinmachnow; Helmut Kahl, Berlin, both of Germany

[73] Assignee: EMI-tec Elektronische Materialien GmbH, Berlin, Germany

[21] Appl. No.: 343,339

[22] Filed: Nov. 22, 1994

[30] Foreign Application Priority Data

Nov. 22, 1993 [DE] Germany ............... 43 40 108.2

[51] Int. Cl.⁶ ............................................. H05K 9/00
[52] U.S. Cl. ............................ 174/35 GC; 174/35 R; 29/592.1
[58] Field of Search ...................... 174/35 R, 35 GC; 361/816, 818, 800; 277/228, 229, 235 R; 29/592.1

[56] References Cited

U.S. PATENT DOCUMENTS

| | | |
|---|---|---|
| 4,652,695 | 3/1987 | Busby . |
| 4,659,869 | 4/1987 | Busby ........................... 174/35 |
| 4,831,498 | 5/1989 | Baba ........................... 174/35 GC |
| 4,945,633 | 8/1990 | Hakanen et al. ................ 29/825 |
| 5,008,485 | 4/1991 | Kitagawa . |
| 5,045,635 | 9/1991 | Kaplo et al. ................ 174/35 GC |
| 5,107,070 | 4/1992 | Benn, Sr. et al. ............ 174/35 GC |
| 5,115,104 | 5/1992 | Bunyan . |
| 5,187,621 | 2/1993 | Tacklind ..................... 360/97.02 |
| 5,194,691 | 3/1993 | McIlwraith ................ 174/35 GC |
| 5,252,782 | 10/1993 | Cantrell et al. ............. 174/35 R |
| 5,401,901 | 3/1995 | Gerry et al. . |
| 5,412,340 | 5/1995 | Tanikoshi ..................... 330/68 |
| 5,416,668 | 5/1995 | Benzoni ....................... 361/816 |

FOREIGN PATENT DOCUMENTS

| | | |
|---|---|---|
| 0 182 391 A3 | 1/1985 | European Pat. Off. . |
| A-0177067 | 4/1986 | European Pat. Off. . |
| A-0428335 | 5/1991 | European Pat. Off. . |
| 0 629 114 A1 | 12/1994 | European Pat. Off. . |
| 0 643 551 A1 | 3/1995 | European Pat. Off. . |
| 0 643 552 A1 | 3/1995 | European Pat. Off. . |
| A-2270956 | 12/1975 | France . |
| 2827676 | 1/1979 | Germany . |
| 89 12 397.2 | 1/1990 | Germany . |
| 39 34 845 A1 | 5/1990 | Germany . |
| 3936534 | 5/1990 | Germany . |
| 3902998 | 8/1990 | Germany . |
| 43 19 965 A1 | 12/1994 | Germany . |

OTHER PUBLICATIONS

European Search Report For Application No. 94250279.0, dated Mar. 10, 1995.

*Primary Examiner*—Bot L. Ledynh
*Attorney, Agent, or Firm*—Alix, Yale & Ristas, LLP

[57] ABSTRACT

A screening element for increasing the electromagnetic compatibility of electronic functional groups. The electronic functional groups being at least partially surrounded by electrically conducting, screening housing walls or containing printed circuit boards which have electrically conductive screening areas. The screening element forming an intermediate element for providing a sealing conductive bridge between screening areas. In the preferred embodiment, the screening element is in the form of a profile seal. The profile seal is composed of at least one compressible or elastic layer of conductive material which is applied directly to a surface of a support element.

28 Claims, 6 Drawing Sheets

1

SCREENING ELEMENT AND PROCESS FOR PRODUCING IT

BACKGROUND OF THE INVENTION

The invention relates to a screening element of the type described in the preamble of claim 1 and to a process for producing such a screening element.

Electronic components, and also measuring, examining and similar apparatus, which are prone to interference by electromagnetic radiation need to be screened from any electromagnetic fields present at the site of use, in order to operate without interference.

They are therefore accommodated in screening housings which have conductive material in their walls and act as a Faraday cage.

Such housings are also used for equipment or assemblies which themselves emit electromagnetic radiation which has to be kept away from the environment, possibly to prevent secret information from being radiated out or to prevent them affecting the operation of external equipment.

Such screens against the entry or exit of electromagnetic interference (EMI) have to be all the more effective nowadays, as more electronic equipment is in use and as this equipment has to be operated side by side with other equipment in confined spaces. Finally, the steady increase in the power and sensitivity levels of such equipment requires additional improvements in screening measures. There is also the problem that there is less and less space available for this screening since the equipment in question is constantly being miniaturised. So-called electromagnetic compatibility (EMC) is a major factor determining the quality of electronic equipment, apart from the actual functions of the equipment.

If, as is usually the case, the housings are multi-part structures which have to be capable of being opened at least occasionally (perhaps to replace the energy source or for maintenance purposes) it is essential, for the purposes of achieving effective screening, that the parts of the housing which have to be detached from one another during opening and brought into contact again during closing should be fitted with flexible conductive seals.

One type of seal known for this purpose consists of resilient metallic seals, but these are comparatively expensive to construct and their reliability can be severely affected by oxidation and contamination.

Flexible sealing profiles consisting of conductive elastomers or elastomers which have been made conductive by the addition of carbon or metal particles to generate conductivity, are also known, e.g. from U.S. Pat. No. 4,659,869 or DE-OS 28 27 676.

Sealing profiles of this kind are normally produced as separate sealing profiles, particularly in an annular closed arrangement, produced primarily as stamped out parts, and these are then placed in the housing which is to be screened, in the region of the wall boundaries, or inserted between conducting screening surfaces, even those of conductive plates, so as to form a conductive and sealing bridge in order to generate a sealed, electromagnetically screened space.

The stamping operations in production of such sealing profiles generate considerable waste and they are tricky to carry out in that the accurate insertion of the highly flexible elements into suitable grooves or the like in the housing requires some skill and can only be automated with difficulty.

Seals of complicated shape as may be required for special housings require special apparatus to insert them, which makes the production of the housing itself expensive. Moreover, accurate insertion is time consuming and requires additional checking operations.

Moreover, damaged sealing profiles of this kind which have been replaced are difficult to recycle owing to their necessarily high content of conductive additives.

It is also known to shape the screening profiles described here by moulding them onto the corresponding housing sections or parts in hot presses and curing them at a relatively high temperature and/or under high pressure. This process cannot be used for pressure-and/or temperature-sensitive parts such as printed circuit boards or metallised plastics housing and owing to the poor tear strength of the materials used it involves problems in removal from moulds and hence has a relatively high wastage level and, in particular in the case of complicated housing or seal shapes, it frequently requires time consuming and expensive finishing work to the pressed edges.

If the edge areas of two stacked printed circuits boards are fitted with a screen so that the space between the two printed circuit boards is electro-magnetically screened from the external surroundings and at the same time is sealed off, relatively high screening profiles may be needed, depending on the spacing of the printed circuit boards, and these screening profiles, produced in one piece as flexible sealing elements, have mechanically poor stability and do not provide a permanent and reliable screen.

SUMMARY OF THE INVENTION

The aim of the invention is therefore to provide a screening element suitable in particular for sealing screening housings which have to be repeatedly opened and closed and for screening the space between printed circuit boards, the structure of said screening element permitting easier and automated handling and being economical to produce in terms of materials, as well as providing a process for producing it. This screening element and the process should be usable, in particular, with housings and printed circuit boards screens which are inexpensive and easy to produce in large numbers.

This objective is achieved by means of a screening element having the features of claim 1 and a process having the features of claim 11.

The invention includes the idea of forming the screening element from a rigid, prefabricated part and a flexible, conductive sealing profile which is applied directly to the surface thereof, more particularly by dispensing it onto the surface. This sealing profile is produced by applying a paste or liquid mass which sets rapidly on the surface and which has the desired properties, this mass emerging from an opening which is guided along the rigid part. The mass is a plastics mass which contains conductive material incorporated therein, particularly in the form of metal particles or carbon particles. A screening element of this kind is much easier to handle than the known sealing rings consisting entirely of flexible material which were difficult to remove from moulds owing to their small cross section and which tore easily. Moreover, owing to the normally small dimensions, the waste around the extrusion channels was always greater than the proportion of material falling onto the workpiece.

The prefabricated rigid part may be strip shaped or frame-shaped, in particular, and produced in a conventional manner by extrusions or injection moulding, for example from a thermoplastics material which cures in air. It may consist, particularly, of a plastics material having conductive materials such as the flexible mass also contains incorporated therein, or it may have a metallised surface. If the conductive sealing mass is suitably applied (e.g. so as to embrace the edge portions of the rigid part), the rigid part may also be made of non-conductive material. Accordingly, an intermediate wall to be inserted in a housing or between two printed circuit boards can be provided on its end edges with a ring of flexible conductive-material according to the invention, so that this inserted wall forms a screening surface which, by suitable attachment to neighbouring conductive surfaces, may also form part of a Faraday cage.

Depending on the particular application, the flexible seal may be applied only to one surface or to several surfaces (usually two opposing surfaces) of the rigid part.

The construction described above creates a screening element having a wide range of applications, which on the one hand avoids the, above-mentioned handling problem and on the other hand achieves good use of the material and allows the material to be recycled.

If the hollow needle or nozzle used to form the profile is guided mechanically, especially by computer control, over the section of the rigid part on which the screening profile is to be provided, this ensures high precision and great flexibility in the shaping of the profile, so that even screening elements of complicated shape can be produced economically in small numbers.

Special cross sectional shapes of the screening element, e.g. with undercuts, recesses and so on, can usefully be produced by prefabricating a correspondingly shaped, substantially rigid strip or a corresponding frame section, for example as an extruded part or by compression moulding.

Quite apart from this, however, it is also possible to form complicated shapes of elastic seal by guiding a needle or nozzle several times over at least predetermined areas of the section on which the flexible screening profile is to be provided, in order to produce a mufti layer screening profile, and thus forming an accurately predetermined profile section. This advantageously makes it possible to produce a predetermined cross sectional profile in several successive operations, either by having the same nozzle passing several times over the place in question or by having a plurality of nozzles successively applying different extruded strips which together form the desired seal.

Preferably, this method can also be used to produce profile cross sections having predetermined properties of elasticity, which is achieved not on the basis of compressibility but on the basis of bending deformation as is the case with bent lip profiles or hollow profiles.

In particular, it is no longer necessary to provide each strip of the material with conductive additives, since even approximately linear conductors will provide a major screening effect on account of the laws of the electromagnetic field.

Using the measures described, it is possible to produce even complicated shapes of sealing profiles on the rigid part with dimensions varying along their length, without any particular problems. The cross section may vary within wide limits along the edge which is to be sealed, depending on the particular requirements. It is also possible to produce shapes of screening profiles join together, whereas they could not have been produced and assembled in one piece in this form. Consequently, there are no lines of separation within the screening seal, with the result that the sealing and screening effect is not lost at any point.

As a result of the fact that materials of different elasticity are applied as the needle or nozzle is passed several times over the predetermined areas, with conductive material being applied at least during one pass, it is possible to produce screens with seals having optimum properties of conductivity, corrosion resistance and flexibility.

The flexible screening profiles may be applied using computer controlled handling equipment which permits three dimensional guiding of the needle or nozzle, a fourth quantity being the metering of the still liquid or pasty material as a function of the advance movement. A fifth control quantity might be the choice of material, i.e. different strips of material may be applied alternately or simultaneously in one operation, so that the material properties of the profile as a whole vary in cross section or longitudinal extent depending on the particular place. These properties may be the conductivity, elasticity (ductility or compressibility) and/or the curing or adhesive properties of the material. In this way, by means of the screening sealing elements it is also possible to achieve a leak-tight sealing of the space which is to be screened by the screening element, by the use of adhesive bonding if adjacent strips of material have the required properties.

BRIEF DESCRIPTION OF THE DRAWINGS

Further advantageous features of the invention are recited in the sub-claims or are explained more fully hereinafter together with a description of the preferred embodiments of the invention referring to the drawings, wherein:

DETAILED DESCRIPTION OF THE INVENTION

Figure 1:
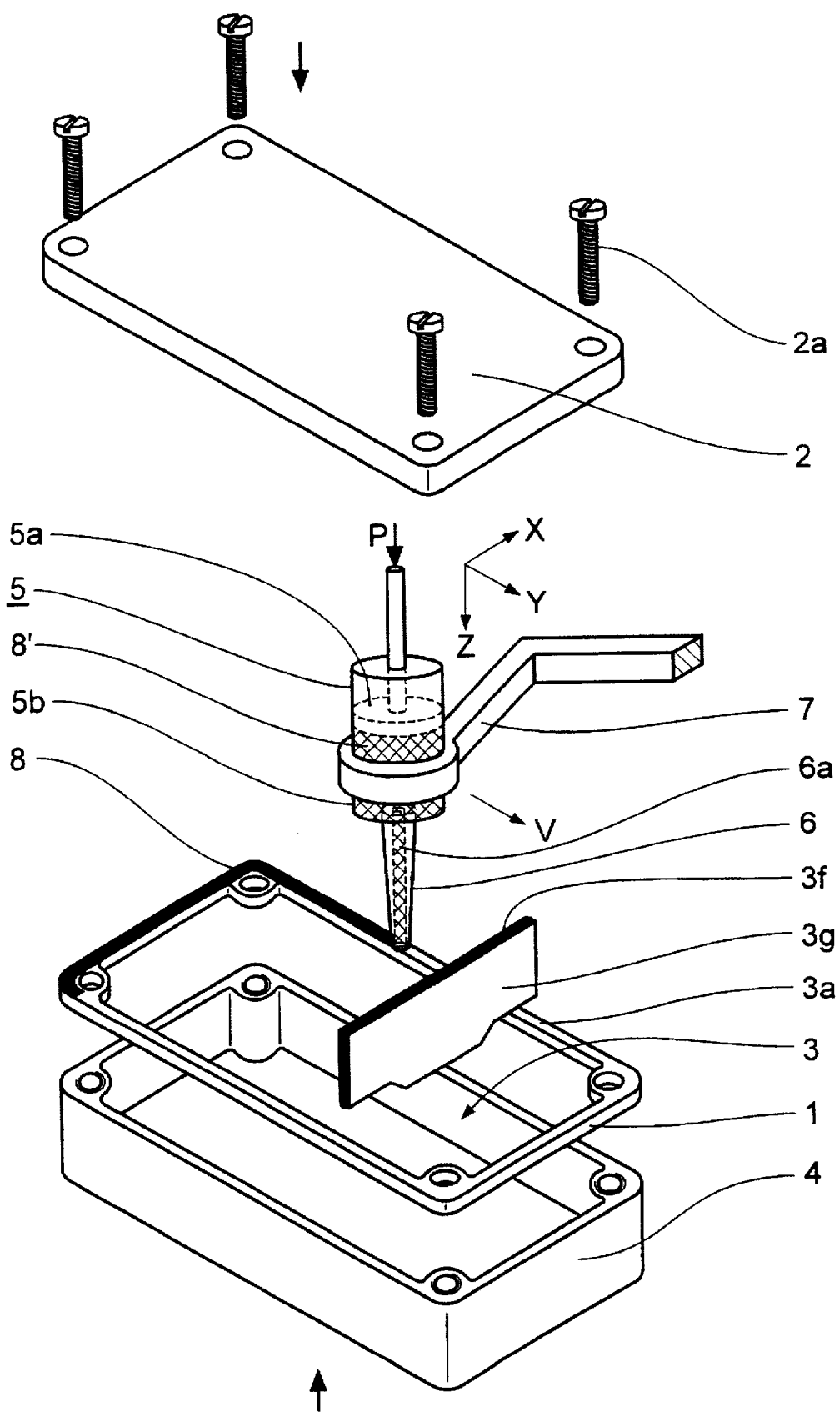
FIG. 1 is a schematic diagram of an embodiment of a screening element according to the invention during manufacture and in relation to its use.

FIG. 1 shows a screening frame 1 which screens the space between two fitted housing parts 2 and 4 which are to be stacked one above the other and with them the components and connections arranged thereon. The basic shape of the screening frame is defined by an injection moulded plastics part 3 having bores which are provided for screwing the housing parts 2 and 4 to the frame 1. instead of housing parts the frame 1 may also serve as an insert between adjacent printed circuit boards, the earthed edges of which, coming into contact with the flexible areas of the frame, may also enclose a screened space.

FIG. 1 also shows how a flexible, conductive, layer 8 consisting of one or more strips is applied to the edges of the rigid edges of the rigid plastics part 3 by means of an applicator needle 6, connected in an air-tight manner to a piston cylinder apparatus 5, this needle being guided together with the piston-cylinder arrangement 5 by a computer controlled robot arm 7 at a small and very precisely maintained spacing from the part 3 at the speed V along the encircling edge 3a, with exertion of a pressure p on the piston 5a of the apparatus 5. The robot arm 7 can be guided in the three spacial directions x, y and z by a corresponding drive.

An intermediate wall 3g can be inserted in the lower part 4 of the housing, before it is closed up by means of screws 2a, the end edges of this wall 3g also being provided with an elastically curing strip 3f, so that this intermediate wall enclosed a separate screened area within the housing.

The cylinder 5b of the apparatus 5 is filled with a pasty silicon polymer 8' with metal particles incorporated therein, kept at ambient temperature and capable of drying rapidly in air and at ambient temperature, this polymer being applied ("dispensed") onto the surface of the housing through the cannulla 6a of the hollow needle or nozzle 6, under the pressure actions on the piston 5a and it adheres on said surface and cures, in the presence of air, to form the flexible sealing layer 8.

The external cross-section of the strip thus produced corresponds to the internal cross-section of the nozzle or hollow need and cures in the ambient air at room temperature to form a flexible strip, whilst a second strip applied before the surface cross links will join integrally with the first.

The (cross-sectional) dimensions and configuration of the sealing layer 8 are additionally determined by the physico-chemical properties of the conductive plastics mass used, particularly its curing speed, viscosity, surface tension with regard to the housing material and its thixotropy, the cross-section of the cannulla, the pressure exerted on the piston, the speed of movement of the needle and environmental influences such as temperature and humidity at the place of manufacture, and can therefore be predetermined by a suitable choice of these parameters.

In the case of the screening frame 1 shown in FIG. 1 the hollow needle 6 is guided along a straight edge portion of the rigid part 3 at higher speed than in the corner sections, so as to achieve optimum shaping of the strip. The properties of the plastics mass can be selected, in particular, by the addition of fillers (carbon black and the like), metal binders, surfactants and curing accelerators or cross-linking substances.

The nature and particle size of the additive which ensures conductivity, such as carbon, silver, copper particles coated with silver or gold, and the like, affects not only the electrical properties but also the mechanical and processing properties of the conductive elastic material.

FIGS. 2a to 2i show, in cross-section, examples of different arrangements of profiled flexible sealing strips which may have screening elements prepared by the process according to the invention if a plurality of application stages are provided for the sealing mass. However, it will be seen that, using the measures according to the invention, the flexible profiles may vary in the longitudinal direction in their geometric dimensions and material properties.

FIGS. 2a to 2d show conductive, less flexible sealing members (shown shaded) with more flexible sealing members which are non-conducting owing to the absence of metal additives thus achieving an optimum combination of sealing and screening action.

Figure 2A:
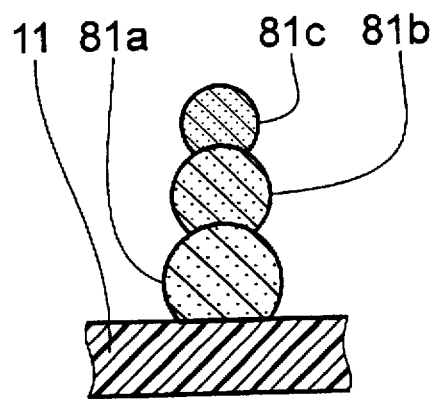
FIGS. 2a to 2i are diagrammatic partial cross sectional views of screening profiles of embodiments of the screening element according to the invention and may be produced in embodiments of the process according to the invention.

FIG. 2a shows, in particular, a screening and sealing structure formed from profiles 81a, 81b, 81c of substantially circular cross-section applied in two steps one on top of the other on the surface of a screening element 11. Such a structure is obtained if the flexible material slightly moistens the surface of the rigid part.

Figure 2B:
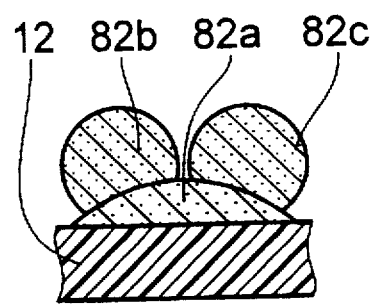

FIG. 2b shows a profile structure on a rigid part 12, produced in three steps from a broad conductive profile part 82a with shallow convexity and a conductive 82c 'dispensed' thereon and a non-conductive part 82b the parts 82b and 82c being substantially circular in cross-section.

Such a structure is obtained if the material of the first profile part 82a substantially moistens the surface of the rigid part and/or if it has been applied with a relatively broad nozzle instead of the needle 6 shown in FIG. 1 whereas the material of parts 82b and 82c shows lesser wetting tendencies with regard to the surface of the part 82a.

Figure 2C:
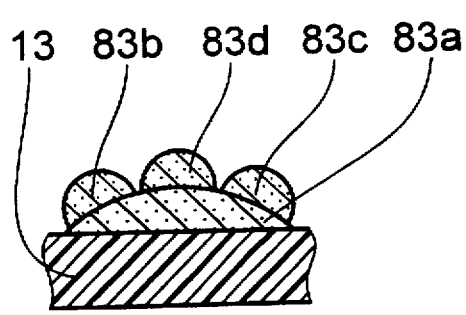

FIG. 2c shows a structure similar to FIG. 2b, in which two substantially semicircular, conductive screening profile sections 83b and 83c have been provided on both sides of a roughly semicircular profile 83d which is highly elastic by nonconductive, centrally arranged on a lower, broad profile part 83a on a housing surface 13.

This latter profile shows great stability to forces acting parallel to the housing surface, but has comparatively low elasticity overall. Therefore, it may be particularly suitable for sliding closures.

Figure 2D:
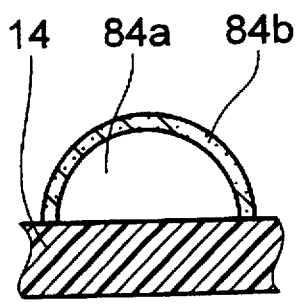

The profile according to FIG. 2d, which consists of an elastic, nonconductive profile part 84a fitted in semicircular manner on to a housing surface 14, and a conductive coating 84b which envelopes the surface thereof, on the other hand has exceptionally good elasticity.

The manufacture of this profile presupposes high wetting capacity and good adhesion between the surfaces of the two profile materials, and it is extremely suitable for flip-open closures, particularly if the closure and housing parts have a relatively large amount of play relatively to one another or themselves have some elasticity.

FIGS. 2e to 2i show sealing and screening profiles consisting exclusively of conductive materials.

Figure 2E:
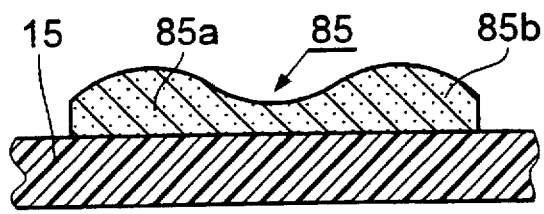

FIG. 2e shows a one-part profile 85 on a rigid base 15 which has two beads 85a and 85b connected by a flat web. Such a profile may be useful for screens and housings having edge-profiled, flip-open closures.

Figure 2F:
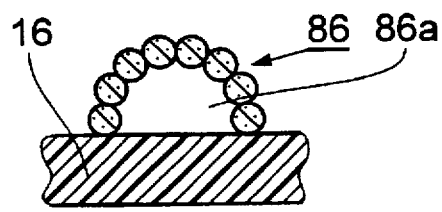

FIG. 2f shows a screening profile 86, of overall semicircular shape made up of a plurality of circular profile strips, on a surface 16 which encloses an air chamber 86a with said profile 86.

Figure 2G:
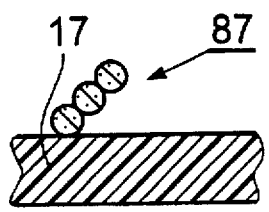

The interaction of the profile with this 'air chamber' ensures good elasticity of the profile as a whole in spite of the comparatively poor elasticity of its components. FIG. 2g shows a profile 87 where the shape is only a section of the shape of the profile in FIG. 2f on a surface 17.

Figure 2H:
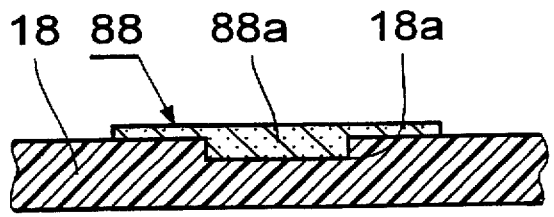

FIG. 2h shows a T shaped profile 88 on a surface of a rigid part 18 which has a rectangular groove 18a, said profile engaging with a broad central part of 88a in the groove 18a and as a whole having a flat surface.

This screening profile is connected to the rigid base part not only through the material but also by interlocking engagement, which additionally increases its stability.

Figure 2I:
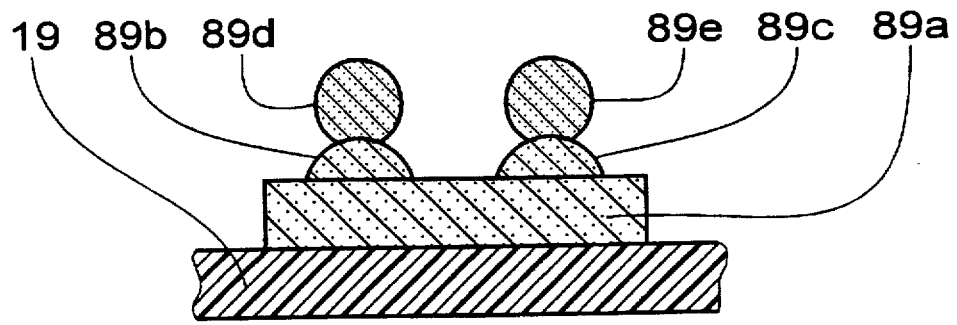

FIG. 2i shows a profile structure consisting of a block 89a, of substantially rectangular cross-section, of conductive elastic material on a flat, broad base part 19 and two profile parts 89b and 89c of shallow convexity arranged side by side thereon, this structure being suitable particularly for screening strong fields, owing to its large cross-section, but thanks to the sealing lips 89d and 89e provided thereon it also has sufficient elasticity. Depending on the particular application, any other desired cross-sections and three dimensional shapes may be achieved by the sequential application of strips of elastically cross-linking plastics material.

Figure 3:
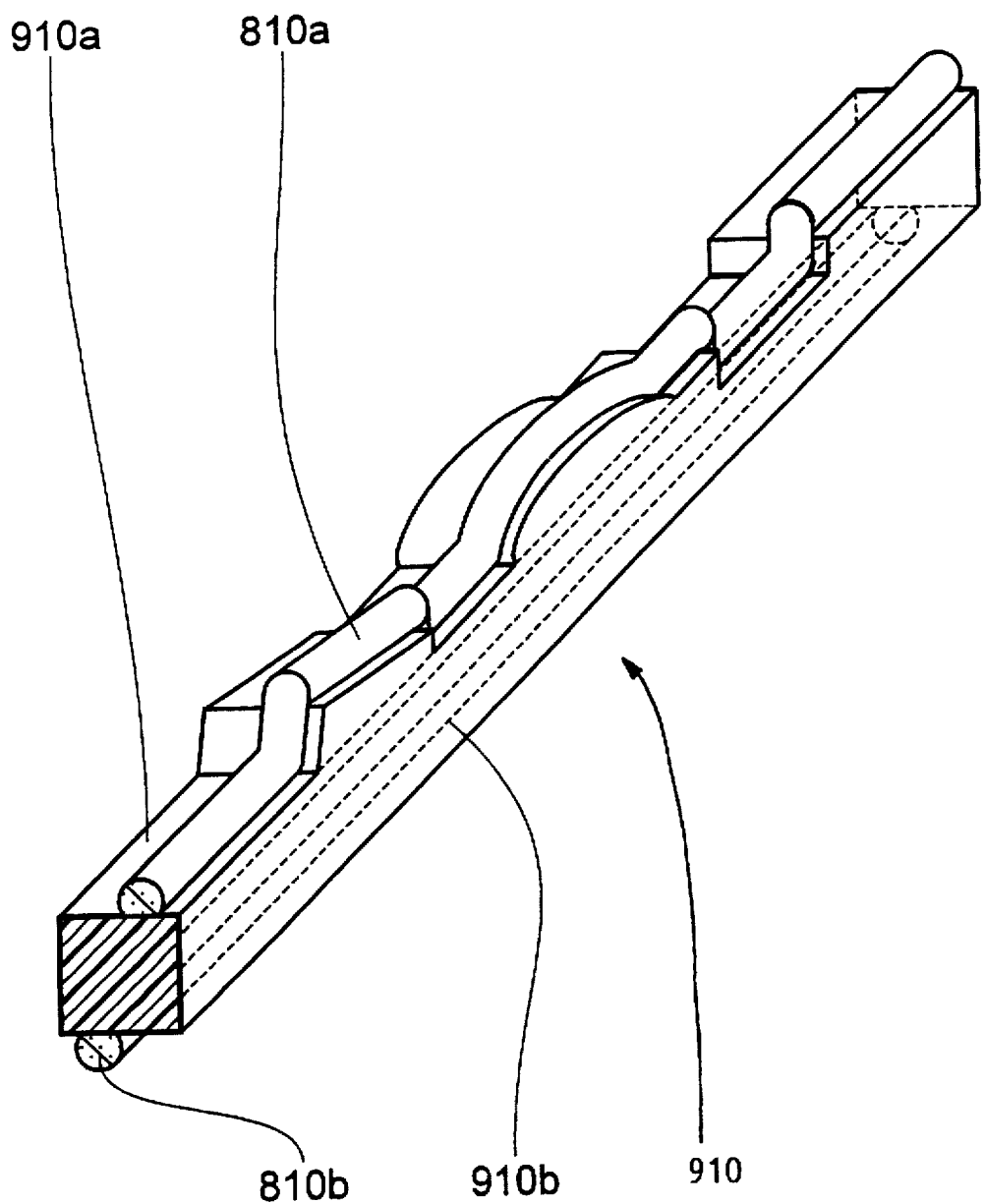
FIG. 3 is a diagrammatic representation of a length of a rigid strip with a screening profile, according to one embodiment of the invention.

FIG. 3 shows a perspective view of an elongate screening element (screening strip) 910 with three smooth and one strongly contoured longitudinal side face 910a, which has a sealing profile 810a or 810b extending in the longitudinal direction on this surface and on the opposite surface. The sealing profile 810a on the surface 910a adapts optimally to the contour thanks to its application by means of a coordinate-controlled dispensing device.

Figure 4A:
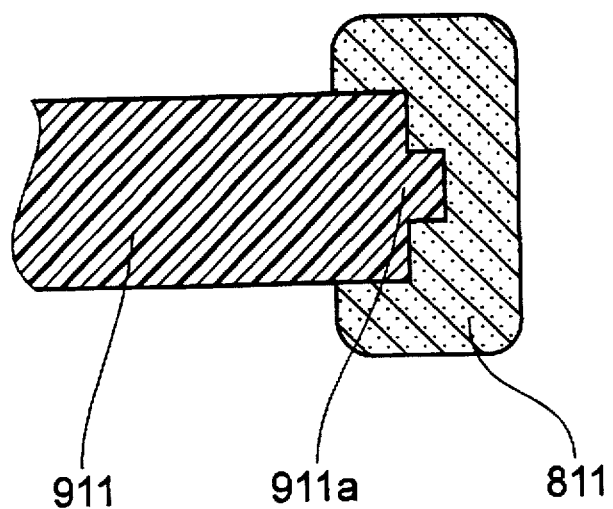
FIGS. 4a and 4b are diagrammatic cross sectional views of two further embodiments of the invention and FIG. 5 is a cross sectional view of an edge portion of two carrier plates for electronic components having a screening frame, according to another embodiment of the invention.
Figure 4B:
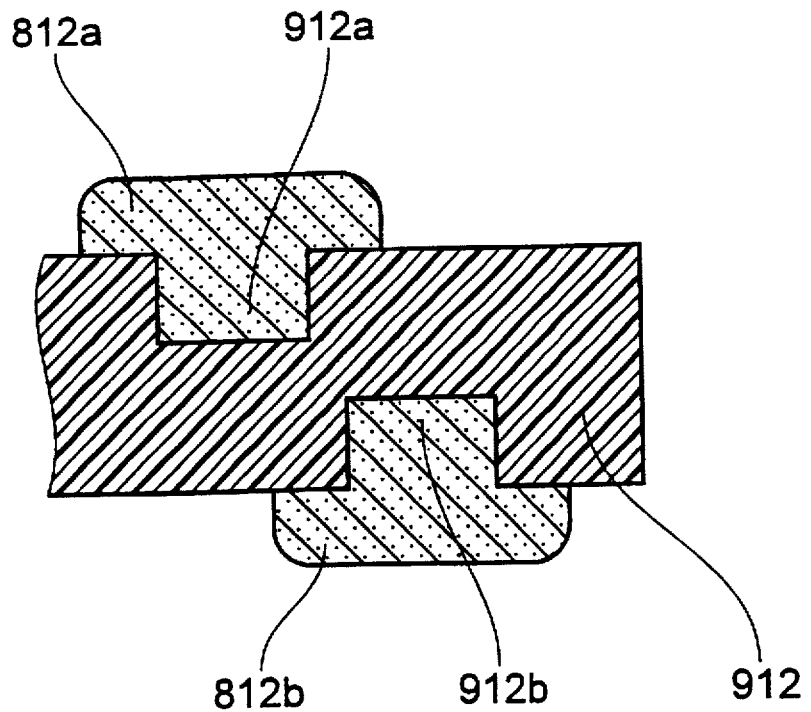

FIGS. 4a and 4b each show a diagrammatical cross-sectional view of a screening element according to a further embodiment of the invention.

FIG. 4a shows a base part 911 consisting of non-conductive plastics, the edge portion of which, provided with a spring 911a, is surrounded by a U-shaped sealing profile 811 of conductive, elastic thermoplastics material. In this screening element, the screening and sealing action is performed exclusively by the U-shaped sealing profile 811, whereas the part 911 acts solely as a support and mechanical reinforcement for it.

FIG. 4b shows the edge portion of a base part 912 of conductive plastics, the opposing surfaces of which each have a groove 912a or 912b provided therein, in which a flexible sealing profile 812a or 812b is provided which extends beyond the edges of the groove on to an area of the surface of the part 912. In this screening element, the screening action is performed by the base part and flexible sealing profile together.

Figure 5:
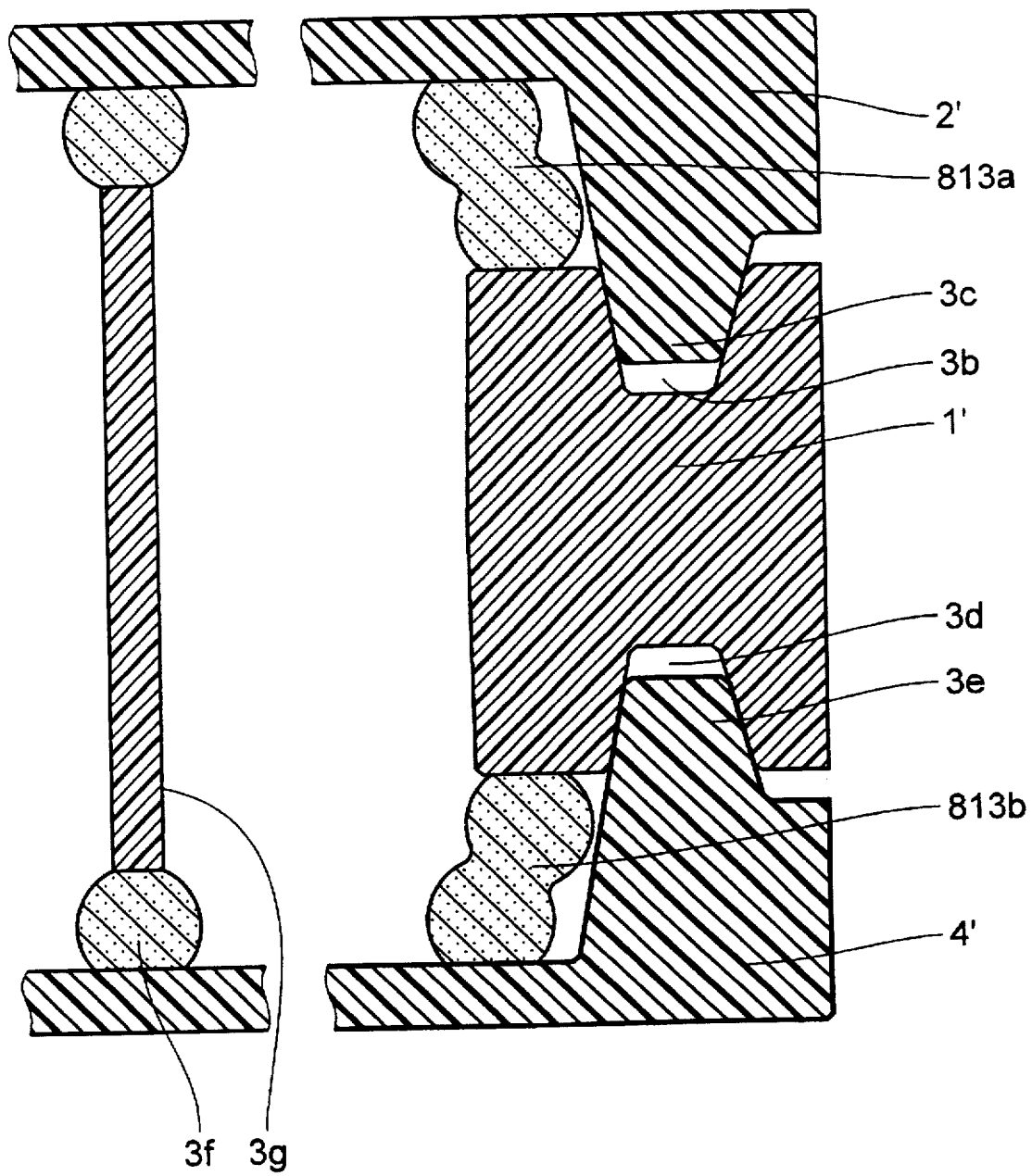

FIG. 5 shows a detail of an embodiment of a housing provided with a screening element according to the invention, in the region of an abutting edge. The housing consists of an upper part 2' provided with an encircling spring 3c which engages in a corresponding encircling groove 3b in a screening frame 1', and a lower housing part 4'. The groove and spring 3b and 3c, respectively, taper so that a relatively tight seal is obtained between the upper housing part and the screening frame, the mutual spacing between the parts 2' and 1', however, being capable of varying on account of manufacturing tolerances. A sealing profile 813a ensures additional sealing and screening in the region of the edge which is independent of the relative position of the upper housing part 2' and the screening frame 1'. As a result of the inclination of the maximum cross-sectional dimension of the sealing profile 813a relative to the direction of the joint between the two housing proportions, the elasticity is aided both by the compressibility and by the bending ability of the profile.

Also shown in section is an inserted intermediate wall 3g which rests on the housing wall by means of a sealing profile 3f produced by a process according to the invention, thereby forming a screen.

The structure of the lower housing part 4', in which are provided a groove 3d and a spring 3e cooperating therewith as well as an elastic, conductive seal 813b is analogous to the structure of the upper housing part 2' as described.

In the manner described, slight inhomogenities in the seal of the screen caused by the fitting of the housing are reliably bridged so as to obtain excellent electromagnetic compatibility.

Whereever the foregoing description speaks of screening elements and rigid parts and the like, these terms also refer to parts which may also act as mechanical supports and housing parts.

Furthermore, the invention is not restrictive in its practical realisization to the preferred embodiment described above. Indeed, numerous variations are possible which make use of the solution described, even with fundamentally different embodiments.

We claim:

1. Screening element for increasing the electromagnetic compatibility of electrical functional groups which are at least partly surrounded by electrically conductive, screening housing walls which have electrically conductive screening areas, the screening element forming an intermediate element to provide a sealing and conducting bridge between screening areas, the longitudinal extent of said screening element being large compared with the dimensions of its cross-section, the improvement comprising that the screening element comprises a rigid support element having opposite top and bottom surfaces and a compressible or elastic layer of self-adhering conductive material formed on each of the top and bottom surfaces of the support element, these layers being connected with each other in an electrically conductive manner, said conductive material being applied directly to a longitudinally arranged surface of said support element, wherein said conductive material forms a flexible sealing layer thereon.

2. Screening element according to claim 1, wherein the compressible or elastic layers each cover the surface of the rigid support element in a strip like configuration.

3. Screening element according to claim 1, wherein the screening element forms a closed frame.

4. Screening element according to claim 1, wherein the support element comprises metallized plastics or plastics containing a conductive additive.

5. Screening element according to claim 1, wherein at least one of the layers is at least partly made up of several partial layers, each partial layer being formed on the one below it and firmly adhering thereto to form a multi-part layer.

6. Screening element according to claim 5, the multi-part layer comprises a partial layer of strongly elastic material selected from the group consisting of non-conductive and poorly conductive material and a carrier layer of not very elastic but strongly conductive material.

7. Screening element according to claim 5, wherein the cross-section of at least one of the layers has a lip-like extension.

8. Screening element according to claim 5, wherein at least one of the layers is made up of a plurality of partial layers in such a way as to form a hollow profile.

9. Screening element according to claim 1, wherein the elastic or compressible layers are formed from a self-curing plastic which elastically cross-links or cures at ambient temperature.

10. Process for producing a screening element according to claim 1, wherein the elastic conductive material is applied directly to the corresponding sections of the rigid support element on which the moulding is to be formed by pressure out of a hollow needle or nozzle in the form of a layer in paste form, or the elastic conductive material is applied by dispensing from a storage container through a hollow needle or nozzle in the form of a layer, the layer having a cross-sectional shape corresponding substantially to the internal cross-section of the nozzle or hollow needle, and after the layer has been applied, whilst still maintaining the cross-sectional shape, the layer is cured or cross-linked to form a corresponding elastic body.

11. Process according to claim 10 wherein the hollow needle or nozzle is guided by drive means along a predetermined path over the area of the part on which the moulding is to be produced.

12. Process according to claim 10 wherein in order to produce a screening element having a layer consisting of several partial strips, the hollow needle or nozzle is guided several times at least over predetermined areas of the section where the multi-part layer is to be provided, so that a given moulding of a predetermined shape is built up from several strips of the elastic, conductive material, each successive strip being applied before the surface of the preceding strip has cured or cross-linked, so that the two strips will be integrally connected after curing or cross-linking.

13. Process according to claim 10, wherein the conductive elastic material is applied at ambient temperature.

14. Process according to claim 10 wherein the hollow needle or nozzle is computer-controlled along a predetermined path over the area of the part on which the moulding is to be produced.

15. Screening element according to claim 1 wherein the screening element forms a closed frame and the screening element has a linear configuration.

16. Screening element according to claim 1 wherein the support element comprises a non-conductive material and that on an edge portion of the support element there is formed a layer of conductive elastic material which cohesively envelopes said support element and at least partially covers its opposing surfaces.

17. Screening element according to claim 1 wherein the support element comprises a non-conductive material and the opposing surfaces have openings connecting them into which the layer of conductive elastic material extends to fill said openings.

18. Screening element according to claim 1, wherein the screening element forms a wall area.

19. Screening element according to claim 1, wherein the screening element has a substantially linear configuration.

20. Screening element according to claim 1, wherein the compressible or elastic layers are composed of a homogeneous material.

21. Screening element for increasing the electromagnetic compatibility of electrical functional groups which contain printed circuit boards having electrically conductive screening areas, the screening element forming an intermediate element to provide a sealing and conducting bridge between screening areas, the longitudinal extent of said screening elements being large compared with the dimensions of the cross-section, the improvement comprising that the screening element comprises a rigid support element having opposite top and bottom surfaces and a compressible or elastic layer of self-adhering conductive material formed on each of the top and bottom surfaces of the support element, these layers being connected with each other in an electrically conductive manner, said conductive material being applied directly to a longitudinally arranged surface of said support element, wherein said conductive material forms a flexible sealing layer thereon.

22. Screening element according to claim 21, wherein the support element comprises metallized plastics or plastics containing a conductive additive.

23. Screening element according to claim 21, wherein at least one elastic or compressible layer is at least partly made up of several partial layers, each partial layer being formed on the one below it and firmly adhering thereto to form a multi-part layer.

24. Screening element according to claim 23, wherein the multi-part layer comprises a partial layer of strongly elastic material selected from the group consisting of non-conductive and poorly conductive material and a carrier layer of not very elastic but strongly conductive material.

25. Screening element according to claim 23, wherein at least one of the layers is made up of a plurality of partial layers in such a way as to form a hollow profile.

26. Screening element according to claim 21, wherein the elastic or compressible layers are formed from a plastic which elastically cross-links or cures at ambient temperature.

27. Screening element according to claim 21 wherein the support element comprises a non-conductive material and that on an edge portion of the support element there is formed a layer of conductive elastic material which cohesively envelopes said support element and at least partially covers its opposing surfaces.

28. Screening element according to claim 21 wherein the support element comprises a non-conductive material and the opposing surfaces have openings connecting them into which the layer of conductive elastic material extends to fill said openings.

* * * * *